United States Patent
Rong et al.

(10) Patent No.: US 9,484,497 B2
(45) Date of Patent: Nov. 1, 2016

(54) SURFACE TREATMENT OF A SEMICONDUCTOR LIGHT EMITTING DEVICE

(71) Applicant: KONINKLIJKE PHILIPS N.V., Eindhoven (NL)

(72) Inventors: Yiwen Rong, San Jose, CA (US); James Gordon Neff, San Jose, CA (US); Tak Seng Thang, San Jose, CA (US)

(73) Assignee: Koninklijke Philips N.V., Eindhoven (NL)

(\*) Notice: Subject to any disclaimer, the term of this patent is extended or adjusted under 35 U.S.C. 154(b) by 0 days.

(21) Appl. No.: 14/880,242

(22) Filed: Oct. 11, 2015

(65) Prior Publication Data

US 2016/0072014 A1 Mar. 10, 2016

Related U.S. Application Data

(63) Continuation of application No. 14/347,252, filed as application No. PCT/IB2012/055243 on Oct. 1, 2012, now Pat. No. 9,159,876.

(60) Provisional application No. 61/543,851, filed on Oct. 6, 2011.

(51) Int. Cl.
    *H01L 33/22* (2010.01)
    *H01L 33/48* (2010.01)
    *H01L 33/50* (2010.01)
    *H01L 33/00* (2010.01)

(52) U.S. Cl.
    CPC .......... *H01L 33/22* (2013.01); *H01L 33/483* (2013.01); *H01L 33/50* (2013.01); *H01L 33/0079* (2013.01)

(58) Field of Classification Search
    CPC ... H01L 33/22; H01L 33/50; H01S 5/18361; H01S 2301/206
    See application file for complete search history.

(56) References Cited

U.S. PATENT DOCUMENTS

| | | | |
|---|---|---|---|
| 5,779,924 A * | 7/1998 | Krames | H01L 33/20 216/24 |
| 7,256,483 B2 | 8/2007 | Epler et al. | |
| 7,932,111 B2 | 4/2011 | Edmond | |
| 7,985,979 B2 | 7/2011 | David et al. | |
| 8,617,909 B2 | 12/2013 | Batres et al. | |
| 8,883,529 B2 | 11/2014 | Wakai et al. | |
| 8,987,711 B2 | 3/2015 | Hiyama et al. | |
| 2006/0091409 A1 | 5/2006 | Epler et al. | |
| 2006/0202219 A1* | 9/2006 | Ohashi | H01L 33/20 257/98 |

(Continued)

FOREIGN PATENT DOCUMENTS

| | | |
|---|---|---|
| EP | 0921568 A2 | 6/1999 |
| JP | 2009054693 | 3/2009 |

(Continued)

OTHER PUBLICATIONS

Fang et al., "Studies of Improving Light Extraction Efficiency of High Power Blue Light Emitting Diode by Photo-Enhanced Chemical Etching", Journal of Crystal Growth, Feb. 13, 2007, pp. 703-705, vol. 298, Elsevier, Amsterdam, NL.

(Continued)

*Primary Examiner* — Armando Rodriguez

(57) ABSTRACT

A semiconductor light-emitting device includes a semiconductor structure having a light-emitting region. A surface of the semiconductor structure has flattened peaks.

8 Claims, 4 Drawing Sheets

(56) References Cited

U.S. PATENT DOCUMENTS

| | | |
|---|---|---|
| 2009/0146170 A1 | 6/2009 | Zhong et al. |
| 2010/0019260 A1 | 1/2010 | Epler et al. |
| 2010/0041170 A1 | 2/2010 | Epler et al. |
| 2010/0052000 A1 | 3/2010 | Ko et al. |
| 2010/0248407 A1 | 9/2010 | Umemura et al. |
| 2011/0114970 A1 | 5/2011 | Teng et al. |
| 2011/0151610 A1 | 6/2011 | Ramappa et al. |

FOREIGN PATENT DOCUMENTS

| | | |
|---|---|---|
| JP | 2010199344 | 9/2010 |
| JP | 2011029574 A | 2/2011 |

OTHER PUBLICATIONS

Kawakami et al., "Synergy Effect of Particle Radiation and Ultraviolet Radiation from Capacitively Coupled Radio Frequency Argon Plasmas on n-GaN Etching Damage", Japanese Journal of Applied Physics, Aug. 1, 2008, pp. 6863-6866, vol. 47, No. 8.

Hsieh et al., "Defect Depth Profiling Using Photoluminescence and Cathodoluminescence Spectroscopy: The Role of Oxygen on Reactive Ion Beam Etching of GaN in O2/Ar Plasmas", Applied Surface Science, May 15, 2001, vol. 175-176, Elsevier, Amsterdam, NL.

Fujii et al., "Increase in the Extraction Efficiency of GaN Based Light Emitting Diodes via Surface Roughening", Applied Physics Letters, AIP, Feb. 9, 2004, pp. 855-857, vol. 84, No. 6., American Institute of Physics, Melville, NY.

Kawakami et al., "Effects of Capacitively Coupled Radio Frequency Krypton and Argon Plasmas on Gallium Nitride Etching Damage", Japanese Journal of Applied Physics, Aug. 1, 2009, pp. 8HF01-1-4, vol. 48, No. 8, pt. 2, The Japan Society of Applied Physics, Tokyo, Japan.

Kawakami et al., "Analysis of GaN Etching Damage by Capacitively Coupled RF Ar Plasma Exposure" Thin Solid Films, Mar. 13, 2008, p. 3478-3481, vol. 516, No. 11, Elsevier-Sequoia S.A., Lausanne, CH.

Coburn et al., "Optical Emission Spectroscopy of Reactive Plasmas: A Method for Correlating Emission Intensities to Reactive Particle Density", Journal of Applied Physics, Jun. 1980, pp. 3134-3136, vol. 51, No. 6.

CN OA, Application 201280049448.1, Mar. 22, 2016, 15 pps.

EPO as ISA, PCT/IB2012/055243 filed Oct. 1, 2012, "International Search Report and Written Opinion", mailed Jan. 2, 2013, 18 pages.

JP Office Action, Application 2014-534016, Aug. 2, 2016, 7 pps.

\* cited by examiner

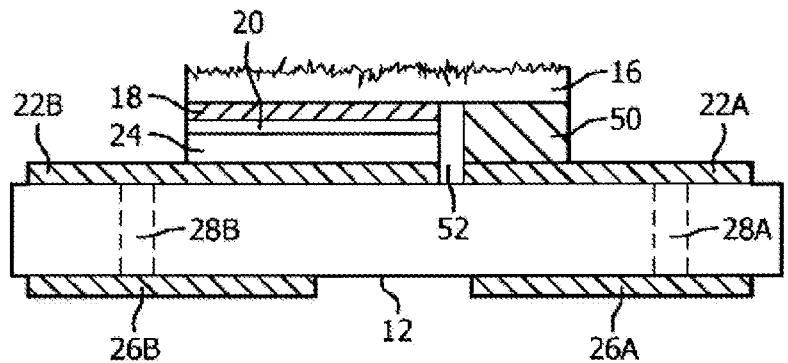
FIG. 1 [PRIOR ART]
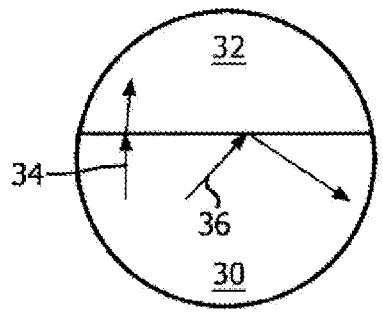
FIG. 2
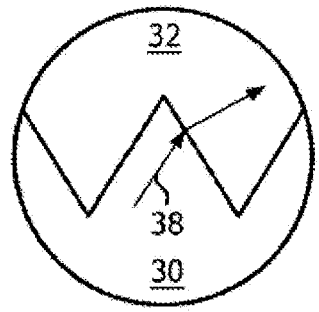
FIG. 3
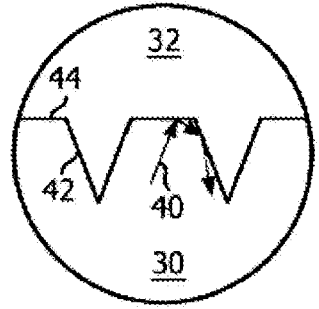
FIG. 4

US 9,484,497 B2

SURFACE TREATMENT OF A SEMICONDUCTOR LIGHT EMITTING DEVICE

CROSS-REFERENCE TO PRIOR APPLICATIONS

This application is a continuation of U.S. patent application Ser. No. 14/347,252 filed on Mar. 26, 2014, which is the U.S. National Phase application under 35 U.S.C. §371 of International Application No. PCT/IB2012/055243 filed on Oct. 1, 2012, which claims the benefit of U.S. application No. 61/543,851 filed on Oct. 6, 2011. These applications are hereby incorporated by reference.

BACKGROUND

Field of Invention

The present invention relates to controlling the amount of flux emitted by a semiconductor light emitting device by treating a surface of the device.

Description of Related Art

Semiconductor light-emitting devices including light emitting diodes (LEDs), resonant cavity light emitting diodes (RCLEDs), vertical cavity laser diodes such as surface-emitting lasers (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a light emitting device described in more detail in U.S. Pat. No. 7,256,483. To form the device of FIG. 1, a conventional LED is formed on a growth substrate. Each LED die includes n-type layers 16, an active layer 18, and p-type layers 20. A metal (metallization layer plus bonding metal) 24 contacts the p-layer. Portions of the p-layer 20, active layer 18, and possibly metal 24 are etched away during the LED forming process, and metal 50 contacts the p-layer 16 on the same side as the p-contact metal 24. An underfill material 52 may be deposited in the voids beneath the LED to reduce thermal gradients across the LED, add mechanical strength to the attachment, and prevent contaminants from contacting the LED material. The metallization layers 50 and 24 are bonded to metal contact pads 22A and 22B, respectively, on a package substrate 12. The package substrate 12 may be formed of the electrically insulating material AN, with metal contact pads 22A and 22B connected to solderable electrodes 26A and 26B using vias 28A and 28B and/or metal traces. The growth substrate is removed, then the light-emitting top surface of the LED (n-layer 16) is roughened for increased light extraction. For example, layer 16 may be photo-electrochemically etched using a KOH solution 46.

SUMMARY

It is an object of the invention to provide a light emitting device where the maximum amount of flux from the device may be controlled.

A semiconductor light-emitting device includes a semiconductor structure having a light-emitting region. A surface of the semiconductor structure has flattened peaks.

BRIEF DESCRIPTION OF THE DRAWINGS

FIG. 1 illustrates an LED from which the growth substrate has been removed.

FIG. 2 illustrates the behavior of light at an interface between air and III-nitride material.

FIG. 3 illustrates the behavior of light at an interface between air and roughened III-nitride material.

FIG. 4 illustrates the behavior of light at an interface between air and III-nitride material treated according to embodiments of the invention.

DETAILED DESCRIPTION

Figure 5:
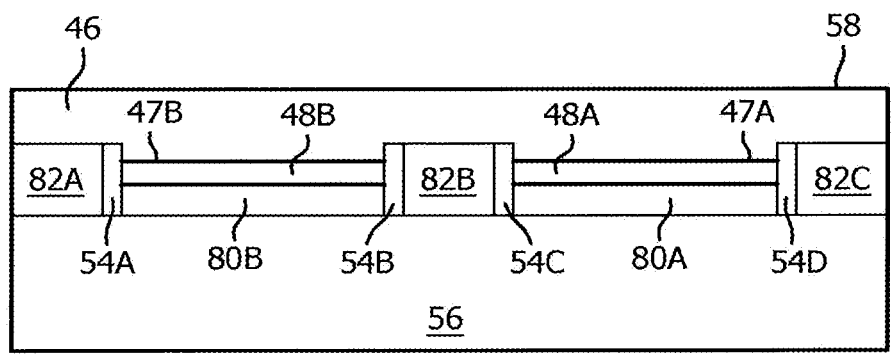
FIG. 5 is a cross sectional view of a device according to embodiments of the invention.

The difference in index of refraction between III-nitride material and air creates total internal reflection at a smooth interface, as illustrated in FIG. 2. At a smooth interface between III-nitride material 30, which has an index of refraction of about 2.4, and air 32, which has an index of refraction of about 1, light 34 emitted at small angles relative to the growth direction escape the III-nitride material. Light 36 emitted at glancing angles is totally internally reflected at the interface and may be lost to absorption within the device.

In order to improve extraction from the device, the top surface of the III-nitride material may be roughened as described above in reference to FIG. 1. The behavior of light 38 emitted at a glancing angle toward a roughened interface is illustrated in FIG. 3. Because of the rough surface of III-nitride material 30, light emitted at a glancing angle relative to the growth direction encounters the surface of the III-nitride material 30 at an angle that allows it to escape into air 32.

However, roughening of the III-nitride surface by photo-electrochemical (PEC) etching is difficult to control. For most practical purposes, extraction of light can only be maximized with PEC etching, as the amount of extraction is difficult to adjust. Some applications, such as for example automotive applications, require a particular maximum flux that may not be exceeded. Modern, high-power LEDs with roughened top surfaces as described above may be too bright for these applications.

In accordance with embodiments of the invention, the roughened surface of a semiconductor light emitting device is treated to reduce the amount of flux extracted from the LED. The treatment may create a surface that reintroduces some total internal reflection at the interface or that causes absorption, as illustrated in FIG. 4. Roughening forms peaks as illustrated in FIG. 3. Post-roughening treatment according to embodiments of the invention may flatten the tops of those peaks 44, as illustrated in FIG. 4. Glancing angle light striking the steep sides 42 of the peaks may be extracted from the III-nitride material 30 into the air 32. Glancing angle light 40 striking the flattened tops 44 may undergo total internal reflection, as illustrated. Internally reflected light may be absorbed.

FIG. 5 illustrates a semiconductor light emitting device according to embodiments of the invention. Though in the discussion below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

The device illustrated in FIG. 5 may be formed by first growing a semiconductor structure on a growth substrate (not shown in FIG. 5), as is known in the art. The growth substrate may be any suitable substrate such as, for example, sapphire, SiC, Si, GaN, or composite substrates. The semiconductor structure includes a light emitting or active region 47A, 47B sandwiched between n- and p-type regions 46 and 48A, 48B. An n-type region 46 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 47 is grown over the n-type region 46. Examples of suitable light emitting regions include a single thick or thin light emitting layer, or a multiple quantum well light emitting region including multiple thin or thick light emitting layers separated by barrier layers. A p-type region 48A, 48B may then be grown over the light emitting region 47. Like the n-type region 46, the p-type region 48A, 48B may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A reflective metal p-contact 80A, 80B is formed on the p-type region 48A, 48B. The semiconductor structure is then patterned by standard photolithographic operations and etched to remove a portion of the entire thickness of the p-type region and a portion of the entire thickness of the light emitting region, to form at least one mesa which reveals a surface of the n-type region on which a metal n-contact 82A is formed. The n-contacts may be distributed, as illustrated by the three n-contacts 82A-82C illustrated in FIG. 5, or a single n-contact may be formed. The n- and p-contacts 82 and 80 may be electrically isolated by a gap 54A-54D, which may be filled with air, ambient gas, or a solid material such as a dielectric or an oxide of silicon. The mesa and p- and n-contacts may be formed in any suitable manner. Forming the mesa and p- and n-contacts is well known to a person of skill in the art. In the regions between devices on a wafer of devices, the semiconductor structure is etched down to an insulating layer, which may be an insulating semiconductor layer that is part of the semiconductor structure, or the growth substrate. The p- and n-contacts may be redistributed by a stack of insulating layers and metals as is known in the art to form at least two large electrical pads. One of the electrical pads is electrically connected to the p-type region of the semiconductor structure and the other of the electrical pads is electrically connected to the n-type region of the semiconductor structure. Electrical pads may be any suitable conductive material including, for example, copper, gold, and alloys. The electrical pads are electrically isolated from each other by a gap which may be filled with an insulating material such as a dielectric, air, or other ambient gas. The stack of layers used to redistribute the contacts and the electrical pads is well known in the art and is not illustrated in FIG. 5.

The semiconductor structure is attached to a mount 56 such that contacts 80A, 80B and 82A-82C are between the mount and the semiconductor structure. In some embodiments, a wafer of devices is diced into individual devices or groups of devices, then the diced devices or groups are attached to a mount, as described above in reference to FIG. 1. In these embodiments, the mount is often larger than the individual devices or groups of devices. In some embodiments, a wafer of devices is attached to a mount on a wafer scale, then after further processing, the wafer of devices and the mount are diced at the same time into individual devices or groups of devices. In these embodiments, the mount is the same size as the individual devices or groups of devices. Dicing can be performed by any suitable method such as scribe-and-break with a laser scribe or sawing and is well known in the art. The mount may be any suitable structure that mechanically supports the semiconductor structure, including, for example, a ceramic mount or wafer, a silicon mount or wafer, for example with conductive vias, or thick metal bonding pads which mechanically support the semiconductor structure, formed by, for example, plating. In some embodiments, mount 56 is a self-supporting structure suitable to attach the semiconductor light emitting device to a substrate such as a PC board. For example, the surface of mount 56 opposite the semiconductor structure (the bottom surface of mount 56 in FIG. 5) may be reflow-solderable.

Figure 6:
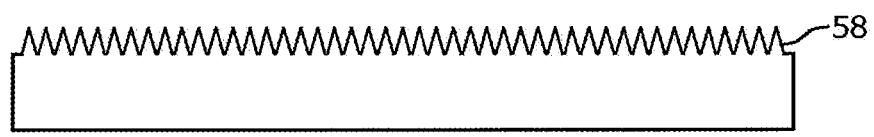
FIG. 6 illustrates a III-nitride surface after roughening.

The growth substrate is removed by any suitable technique. For example, the growth substrate may be removed by laser lift-off, etching, mechanical techniques such as grinding, or a combination of techniques. The surface 58 of the semiconductor structure exposed by removing the growth substrate, typically a surface of n-type region 46, may be optionally thinned and roughened, for example by PEC etching. FIG. 6 illustrates a surface 58 roughened by PEC etching.

Figure 7:
FIG. 7 illustrates a III-nitride surface after treatment according to embodiments of the invention.

The surface 58 of FIG. 6 is then treated to reduce extraction, as illustrated in FIG. 7. In some embodiments, surface 58 is treated with plasma, which may flatten the peaks formed by PEC etching, as illustrated in FIG. 7. Any suitable standard commercially-available plasma etching and/or cleaning system may be used. The plasma used may be any suitable plasma, including, for example, Ar, O, and mixtures. The spike-type features illustrated in FIG. 6 may be smoothed by plasma treatment in FIG. 7, which may lead to more total internal reflection at the interface, which may reduce extraction from the device. Plasma treatment may be either physical (i.e. sputter etching) or chemical (i.e. chemical etching) or a combination of physical and chemical etching.

Figure 8:
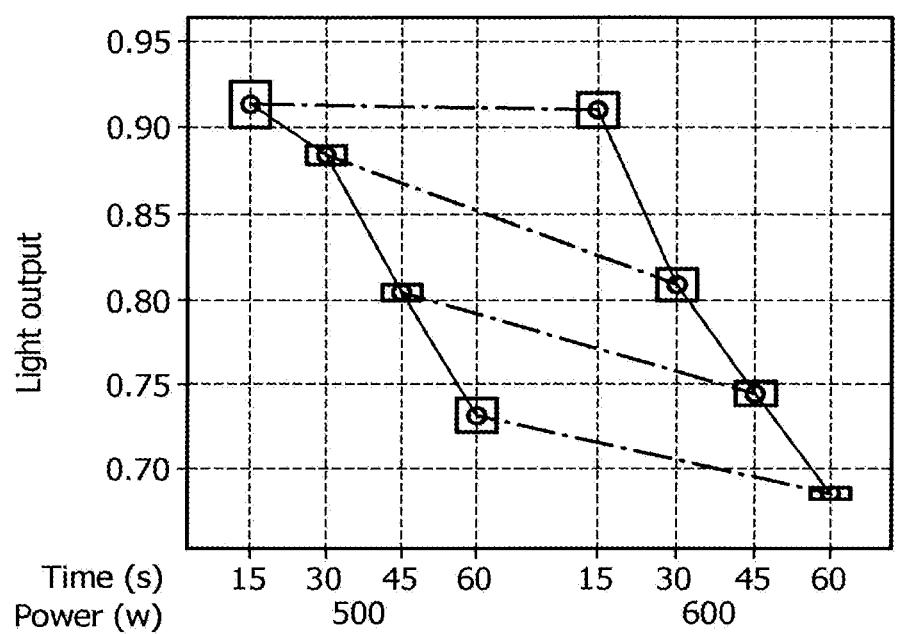
FIG. 8 illustrates light output as a function of treatment time for plasma treatment at low power and at higher power.

FIG. 8 illustrates light output as a function of plasma treatment time for a surface of a III-nitride device treated with plasma at 500 W and at 600 W. The four points on the left side of the figure illustrate light output for a surface treated with plasma at 500 W and the four points on the right side of the figure illustrate light output for a surface treated with plasma at 600 W. FIG. 8 illustrates that the light output or amount of extraction is roughly linearly proportional to the treatment time. The longer the surface is treated with plasma at either energy, the less light is extracted from the surface. In addition, the reduction in extraction is proportional to the power—treatment at higher power for a given time reduced extraction more than treatment at lower power for the same time. The inventors have observed that light output can be reduced by 30% of the maximum value (i.e. light output from a roughened surface without any treatment).

The following table compares a roughened surface with no post-roughening plasma treatment with a roughened surface treated for 60 s with plasma at 600 W. $R_a$ is the mean roughness of the surface and $R_{max}$ is the maximum height of surface features. Light output is given in arbitrary units.

| Surface | Light Output | $R_a$ (nm) | $R_{max}$ (nm) |
|---|---|---|---|
| No treatment | 420 | 185.8 | 1598 |
| 600 W treatment, 60 s | 287.28 | 133.4 | 1049 |

As illustrated in the above table, both light output and surface roughness are reduced for a treated surface. For example, as a result of treatment according to embodiments of the invention, the mean surface roughness may be reduced by at least 10% in some embodiments, by at least 20% in some embodiments, and by at least 30% in some embodiments. As a result of treatment according to embodiments of the invention, the maximum height of surface features may be reduced by at least 20% in some embodiments, by at least 30% in some embodiments, and by at least 40% in some embodiments.

Figure 9:
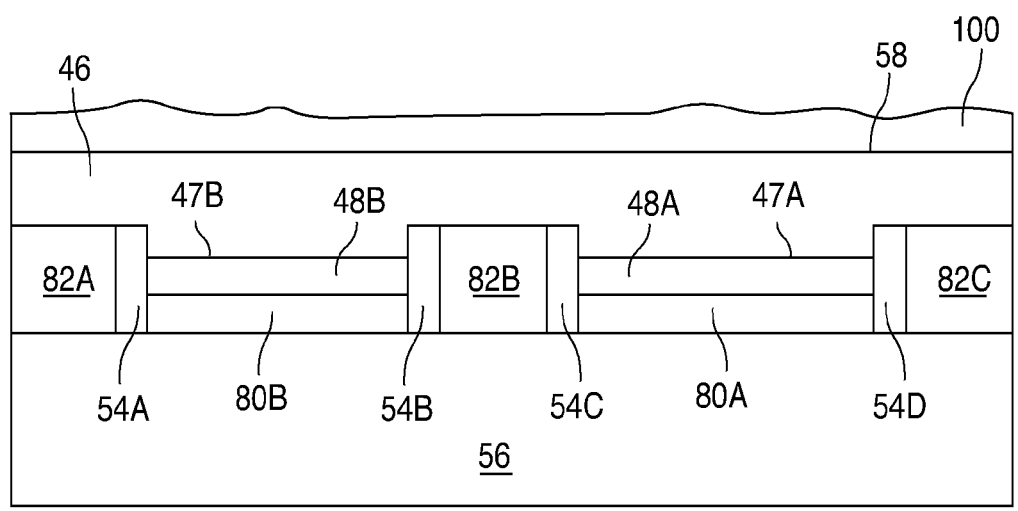
FIG. 9 is a cross sectional view of a device including a wavelength converting material according to embodiments of the invention.

After post-roughening treatment as described above, one or more optional structures such as filters, lenses, dichroic materials, or wavelength converting materials 100 may be formed over the treated surface 58, as illustrated in FIG. 9. A wavelength converting material may be formed such that all or only a portion of the light emitted by the light emitting device and incident on the wavelength converting material may be converted by the wavelength converting material. Unconverted light emitted by the light emitting device may be part of the final spectrum of light, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting material, and a UV-emitting LED combined with blue-, green-, and red-emitting wavelength converting materials. Wavelength converting materials emitting other colors of light may be added to tailor the spectrum of light emitted from the device. The wavelength converting material may be conventional phosphor particles, organic semiconductors, II-VI or III-V semiconductors, II-VI or III-V semiconductor quantum dots or nanocrystals, dyes, polymers, or materials such as GaN that luminesce. Phosphor particles may have an average diameter between 5 and 50 μm in some embodiments. Any suitable phosphor may be used, including but not limited to garnet-based phosphors such as $Y_3Al_5O_{12}$:Ce (YAG), $Lu_3Al_5O_{12}$:Ce (LuAG), $Y_3Al_{5-x}Ga_xO_{12}$:Ce (YAlGaG), $(Ba_{1-x}Sr_x)SiO_3$:Eu (BOSE), and nitride-based phosphors such as (Ca,Sr)AlSiN$_3$:Eu and $(Ca,Sr,Ba)_2Si_5N_8$:Eu.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A semiconductor light-emitting device, comprising:
    a semiconductor structure comprising a light-emitting region, wherein the semiconductor structure comprises:
        an n-type region;
        a p-type region;
        the light-emitting region between the n- and the p-type regions;
        an n-contact disposed on the n-type region; and
        a p-contact disposed on the p-type region, wherein the n-contact is insulated by a gap from the active region, the p-type region, and the p-contact,
    wherein a surface of the semiconductor structure comprises flattened peaks.

2. The device of claim 1, wherein each flattened peak comprises a flat top.

3. The device of claim 1, further comprising a wavelength converting material over the surface.

4. The device of claim 1, further comprising a mount, wherein the semiconductor structure is attached to the mount.

5. The device of claim 1, wherein the surface comprises a surface of the n-type region.

6. The device of claim 1, wherein the gap is filled with an insulating material.

7. The device of claim 1, wherein the flattened peaks are formed by etching the surface and then treating the surface with plasma.

8. A light-emitting device, comprising:
    a semiconductor structure, comprising:
        an n-type region, wherein a surface of the n-type region comprises flattened peaks;
        a p-type region;
        a light-emitting region between the n- and the p-type regions;
        an n-contact to the n-type region; and
        a p-contact to the p-type region wherein the n-contact is insulated by a gap from the active region, the p-type region, and the p-contact;
    a wavelength converting material over the surface of the n-type region; and
    a mount supporting the semiconductor region.

* * * * *